United States Patent [19]
Bedi et al.

[11] Patent Number: 6,094,334
[45] Date of Patent: Jul. 25, 2000

[54] POLYMER CHUCK WITH HEATER AND METHOD OF MANUFACTURE

[75] Inventors: Surinder S. Bedi, Fremont; Shamouil Shamouilian, San Jose; Syed H. Askari, Santa Clara; Arnold Kholodenko, San Francisco; Jon T. Clinton, San Jose; Alexander M. Veytser, Mountain View; Liang-Guo Wang, Milpitas; You Wang, Cupertino, all of Calif.

[73] Assignee: Applied Materials, Inc., Santa Clara, Calif.

[21] Appl. No.: 09/261,083

[22] Filed: Mar. 2, 1999

[51] Int. Cl.$^7$ .................................................. H01G 23/00
[52] U.S. Cl. ........................................... 361/234; 361/115
[58] Field of Search .................................... 361/234, 103, 361/115; 279/128

[56] References Cited

U.S. PATENT DOCUMENTS

| | | | |
|---|---|---|---|
| 4,384,918 | 5/1983 | Abe | 361/234 |
| 4,771,730 | 9/1988 | Tezuka | 118/723 |
| 5,280,156 | 1/1994 | Niori et al. | 219/385 |
| 5,376,213 | 12/1994 | Ueda et al. | 156/345 |
| 5,581,874 | 12/1996 | Aoki et al. | 29/825 |
| 5,591,269 | 1/1997 | Arami et al. | 118/723 R |
| 5,618,350 | 4/1997 | Ishikawa et al. | 118/725 |
| 5,625,526 | 4/1997 | Watanabe et al. | 361/234 |
| 5,665,166 | 9/1997 | Deguchi et al. | 118/723 E |
| 5,691,876 | 11/1997 | Chen et al. | 361/234 |
| 5,900,103 | 5/1999 | Tomoyasu et al. | 156/345 |

*Primary Examiner*—Stephen W. Jackson
*Attorney, Agent, or Firm*—Janah and Associates

[57] ABSTRACT

An electrostatic chuck 20 for holding a substrate 25 in a process chamber 30 comprises an electrostatic member 115 comprising a polymer 120 covering an electrode 125, the polymer 120 having a receiving surface 135 for receiving the substrate 25. A heater 130 abutting the polymer 120 is provided to heat the substrate 25 during processing of the substrate 25. The heater 130 has a resistance that is sufficiently low to heat the substrate 25 without causing excessive thermal degradation of the polymer 120.

58 Claims, 2 Drawing Sheets

POLYMER CHUCK WITH HEATER AND METHOD OF MANUFACTURE

BACKGROUND

The present invention relates to an electrostatic chuck for holding and heating a substrate in a process chamber.

In the fabrication of integrated circuits, an electrostatic chuck is used to hold a substrate in a chamber to prevent movement or misalignment of the substrate during processing. A typical electrostatic chuck comprises an electrode covered by a ceramic or polymer insulator. The substrate held on the chuck is processed by a plasma of process gas and the plasma heats up the substrate. Generally, a heat transfer gas is provided between the surface of the chuck and the backside of the substrate to enhance heat transfer rates therebetween and control temperatures across the substrate. For example, in the etching of electrical interconnects which have small dimensions and are positioned very close together, there is a need for precise control of the temperature of the substrate to provide reproducible and accurate shapes of the etched features. The heat transfer gas increases heat conduction between the chuck and the substrate and maintains more uniform temperatures across the surface of the substrate by either heating or cooling the substrate.

In addition to precise temperature control, it is also desirable to have a chuck capable of heating the substrate to temperatures higher than those provided by the heat load of the plasma. Faster integrated circuits are formed by making the electrical interconnects of the circuits out of materials having high electrical conductivities. For example, copper or platinum can be substituted for lower conductivity aluminum to make faster interconnects. However, these materials are often processed at higher temperatures; for example, etching of these materials can require heating the substrate to temperatures of 250 to 400° C. Increasing the power level of the plasma can heat the substrate to higher temperatures by imparting more kinetic energy to the ions that strike the substrate. However, it is not always desirable to increase the energy of the plasma ions because a higher energy plasma can cause charge up damage of the layers below the etched layer or otherwise change the shape of the etched features.

The substrate can also be heated by applying heat to the substrate from an external heat source, such as an infrared lamp outside the chamber, that projects radiation through a window in the chamber. However, infrared lamps are difficult to use in chambers that do not have little space for a window, for example, when inductor coils or other processing components are adjacent to the chamber walls. Furthermore, the inefficient transmission of heat through the volume of the chamber results in a long response time to raise the substrate to the desired temperature. This makes it even more difficult to maintain the temperature of the substrate within a narrow temperature range, especially when the heat load of the plasma in the chamber fluctuates during processing.

In another approach, described in U.S. Pat. No. 5,280,156, the electrostatic chuck comprises an electrode and heater, both of which are embedded in a monolithic ceramic of aluminum nitride. However, it is difficult to form a gas-tight seal between the hard ceramic and the overlying substrate to hold the heat transfer gas below the substrate. Leakage of heat transfer gas causes portions of the substrate near the leakage points to become hotter or colder than other portions of the substrate. This results in non-uniform temperatures and uneven processing rates across the substrate. In addition, the ceramic insulator comprises small grains that separate and flake off when their grain boundary regions are eroded by the corrosive process gas to form particles that contaminant the substrate. Also, different thermal expansion coefficients of the heating element and ceramic can lead to thermal stresses that result in failure of the chuck and loss of the entire substrate.

Therefore, there is a need for an electrostatic chuck that can securely hold a substrate and quickly heat the substrate during processing. It is further desirable to have an electrostatic chuck that can rapidly raise or lower the temperature of the substrate to regulate its temperature regardless of fluctuations in the plasma heat load. It is also desirable for the chuck to exhibit little or no erosion or particle generation during processing.

SUMMARY

An electrostatic chuck according to the present invention is useful for holding a substrate and maintaining the substrate in a narrow range of temperatures. The electrostatic chuck comprises a polymer having a surface for receiving the substrate. An electrode covered by the polymer is chargeable to electrostatically hold the substrate. A heater is abutting the polymer to heat the substrate held on the chuck. Preferably, the heater is in the polymer to enhance thermal transfer rates. The heater comprises a resistive heating element having a resistance that is sufficiently low to heat the substrate substantially without thermal degradation of the polymer and sufficiently high to raise the temperature of the substrate by at least about 150° C. to achieve the desired processing temperatures.

The electrostatic chuck is fabricated by a method comprising the steps of forming a polymer enclosing an electrode and a heater, the polymer having a surface adapted to receive the substrate. Preferably, the method comprises forming one or more layers comprising the polymer, electrode, and heater, and joining the layers to one another, for example, by applying a pressure on the layers and heating the layers.

In another aspect, the present invention comprises a method of processing a substrate in a process chamber. In the method, a substrate is placed on a receiving surface of an electrostatic chuck, the electrostatic chuck comprising polymer covering an electrode and a heater. The electrode is charged to electrostatically hold the substrate. A power level of the heater is controlled to regulate a temperature of the substrate.

The electrostatic chuck of the present invention is particularly useful for processing a substrate in a process chamber, the process chamber further comprising a gas distributor, a gas energizer, and a gas exhaust, whereby gas distributed by the gas distributor is energized by the gas energizer to process the substrate held on the electrostatic chuck, and exhausted by the gas exhaust.

In another embodiment, the electrostatic chuck comprises a polymer having a surface for receiving the substrate, the polymer covering an electrode that is chargeable for electrostatically holding the substrate. A thermal conductor is below the polymer and a heater is below the thermal conductor. A method of fabricating this chuck comprises the steps of forming an assembly comprising layers of polymer, an electrode, a thermal conductor, and a heater; and joining the layers to one another to form the electrostatic chuck.

In yet another embodiment, the electrostatic chuck comprises a polymer having a surface for receiving the substrate. An electrode is covered by the polymer, the electrode being chargeable for electrostatically holding the substrate. A heater is covered by the polymer and provided for heating the substrate. A thermal insulator is below the heater. A method of fabricating the electrostatic chuck comprises the steps of forming an assembly comprising layers of polymer, an electrode, a heater, and a thermal insulator; and joining the layers to one another to form the electrostatic chuck.

DRAWINGS

These features, aspects, and advantages of the present invention will become better understood with regard to the following description, appended claims, and accompanying drawings which illustrate examples of the invention, where:

DESCRIPTION

Figure 1:
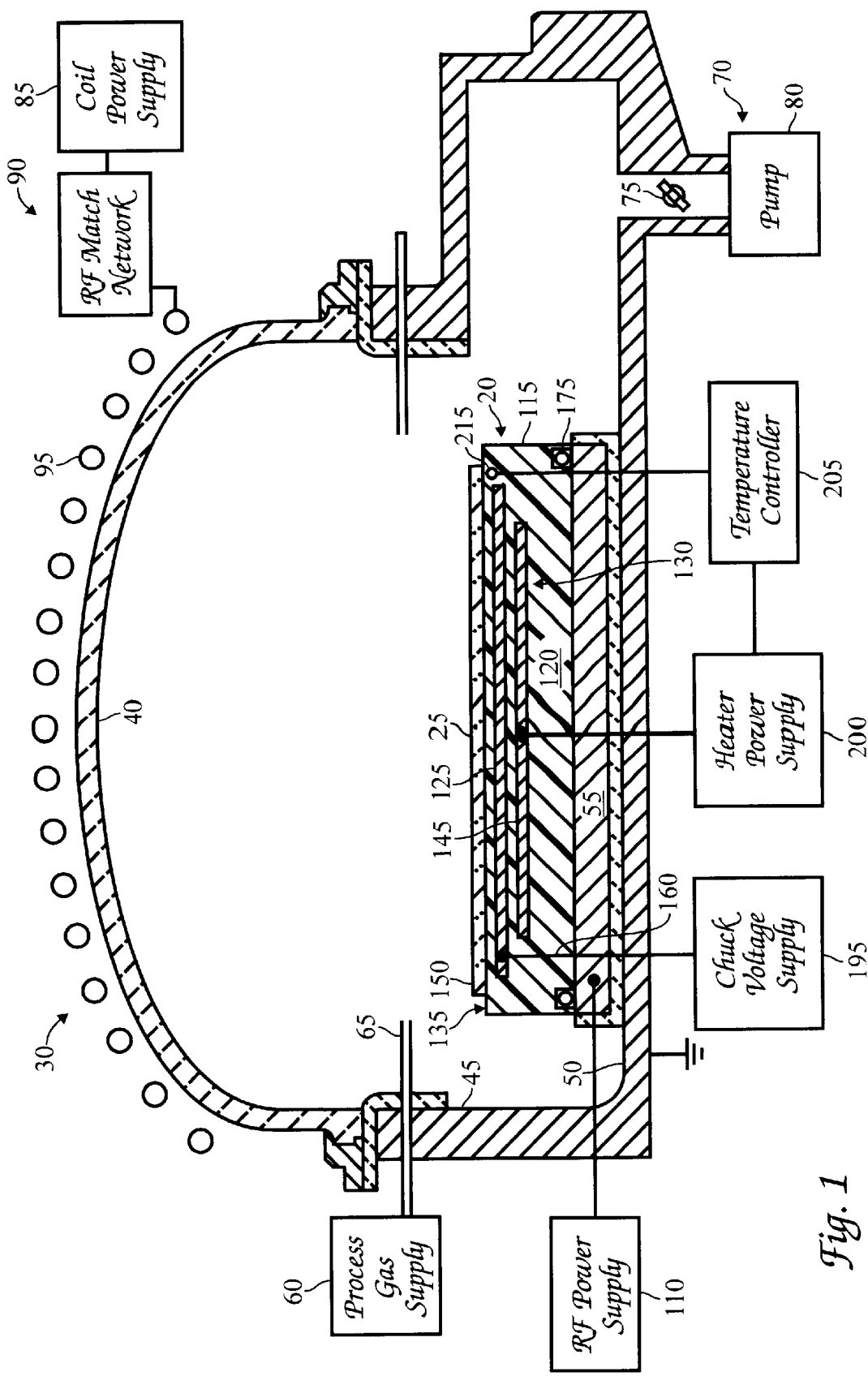
FIG. 1 is a schematic sectional side view of a process chamber showing an electrostatic chuck comprising a polymer covering an electrode and having an abutting heater.

An electrostatic chuck 20 is used to hold a substrate 25, such as a semiconductor wafer, in a process chamber 30, as illustrated in FIG. 1. The process chamber 30 comprises an enclosure defined by a ceiling 40, sidewalls 45, and a surface 50 for supporting the electrostatic chuck 20. The electrostatic chuck 20 can be supported on a support 55 on the surface 50 (as shown) or attached directly to the surface 50 (not shown). While the present invention is illustrated by way of an electrostatic chuck 20 for supporting semiconductor substrates in a process chamber 30, the present invention also encompasses other supports for supporting other substrates, such as circuit boards and flat panel displays, in other process chambers, as apparent to those skilled in the art, without deviating from the scope of the invention. Thus, the present invention should not be limited to the illustrative embodiments of the invention described herein.

The process chamber 30 comprises a gas distributor 65 for introducing process gas from a process gas supply 60 into the process chamber 30, and an exhaust system 70 comprising a throttle valve 75 and a pump 80 for exhausting spent gas and byproducts from the process chamber 30. Optionally, a gas energizer 90 inductively or capacitively couples an electric field into the process chamber 30 to form an energized process gas or plasma. For example, as shown in FIG. 1, the process gas can be energized via inductive coupling by applying a RF current from a coil power supply 85 to an inductor coil 95 adjacent to the ceiling 40. The process gas can also be energized by capacitive coupling by applying a RF bias voltage from a RF power supply 110 across the support 55 and a grounded portion of the ceiling 40 or sidewall 45. The frequency of the RF power applied to the support 55 or inductor coil 95 is typically from about 50 KHz to about 60 MHz. The gas energizer 90 can also comprise a source of microwave energy that is passed through the process gas to energize the gas by dissociation of the gas molecules.

The electrostatic chuck 20 comprises an electrostatic member 115 comprising a polymer 120 having a receiving surface 135 for receiving the substrate 25. The polymer 120 covers an electrode 125 that is chargeable to electrostatically hold the substrate 25. Preferably, the electrode 125 is embedded in the polymer 120, as shown in FIG. 1, to allow the electrostatic attraction between the electrode 125 and the overlying substrate 25 to be maximized by increasing the voltage applied to the electrode 125, without causing electrical shorts or arcing between the electrode and the plasma. The electrode 125 can comprise a monopolar or a bipolar electrode, and is fabricated from an electrically conducting metal, such as for example, aluminum, copper, silver, gold, molybdenum, tantalum, titanium, or mixtures thereof. Typically, the electrode 125 comprises a solid layer of conducting material, a wire mesh, or a patterned layer. The electrode 125 is shaped and sized to hold the substrate 25 to the electrostatic chuck 20 by a sufficiently high electrostatic force. For example, in one version, the electrode 125 comprises a molybdenum mesh having a circular shape corresponding to the shape of the substrate 25 to maximize electrostatic attraction forces. For a circular substrate 25 having a diameter of 200 to 300 mm (8 to 12 inches), the electrode 125 typically comprises an area of about 50 to about 250 mm$^2$.

Figure 2:
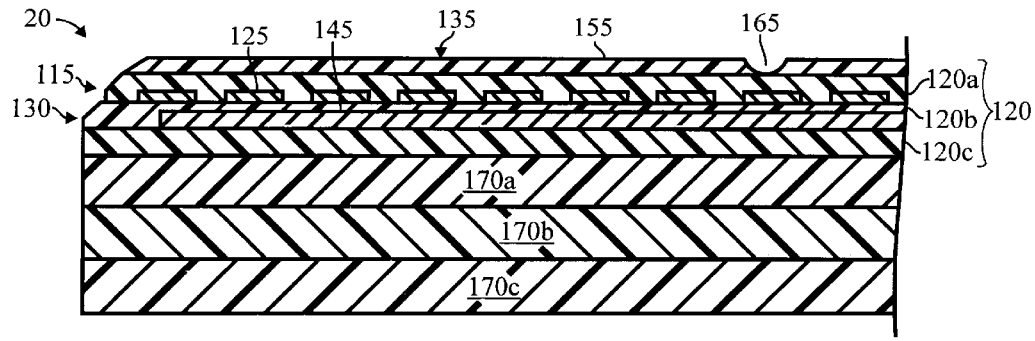
FIG. 2 is a schematic partial sectional side view of an electrostatic chuck having a thermal insulator below the heater.

A heater 130 abutting the polymer 120 is provided to heat the substrate 25 during processing. The abutting heater 130 is adjacent to the polymer 120, for example, directly below the polymer 120 as shown in FIG. 2, to maximize heat transfer rates between the polymer and the heater 130. The abutting heater 130 serves as an instantaneous heat source that also allows rapid heating up of the substrate 25 because it is so close to the substrate, to provide faster and more accurate control of the temperature of the substrate 25 even when the heat from the plasma fluctuates during processing.

Preferably, the heater 130 is embedded inside the polymer 120. The embedded structure provides better heat transfer rates from the heater 130 through the polymer 120 and to the substrate 25 because there are no thermal discontinuities, such as delineated interfaces between different materials, that impeded the flow of heat from the heater 120 to the substrate 25. The embedded heater 130 also reduces heat losses to the surrounding chamber because the polymer 120 surrounding the sides and bottom of the heater 130 is made sufficiently thick to thermally isolate the heater 130 from the chamber 20, and cause heat to flow along the path of least resistance above the heater 130 to the substrate 25. In addition, because the heater 130 is embedded and entirely enclosed by the polymer 120, the polymer 120 serves as an electrically insulating material that prevents coupling of the electrical energy supplied to the heater 130 to the plasma in the chamber. Such coupling of electrical energy between the heater 130 and the plasma would cause instabilities and disturbances in the plasma field that would adversely affect the uniformity of processing of the substrate 25.

The heater 130 comprises one or more resistive heating elements 145 through which an electric current is passed to heat the substrate 25 on the receiving surface 135. The resistive heating element 145 are made from copper, iron, molybdenum, tungsten, inconel, or alloys thereof, and are shaped and sized to uniformly heat the entire surface of the substrate 25. For example, the resistive heating element 145 can comprise a planar element or flat coil wound in a spiraled shape, having an area about the size of the substrate 25.

The resistive heating element 145 comprises a resistance that is sufficiently low to heat the substrate 25 substantially without excessive thermal degradation of the polymer 120. Generally, a high temperature polymer capable of withstanding temperatures of 350 to 400° C. is selected to enclose the heater 145. However, even high temperature polymers have temperature limits, which if exceeded, will cause the thermoplastic polymers to melt and the thermoset polymers to carbonize or otherwise thermally degrade.

In addition, the resistive heating element 145 comprises a resistance that is sufficiently high to raise the temperature of the substrate 25 by at least about 150° C. to facilitate processing of materials such as the etching of high conductivity metals, such as for example, platinum or copper. Generally, a plasma heats up a substrate 25 because of the energetic impingement of charged and neutral plasma species onto the surface of the substrate 25. While the energy of the plasma can be increased to increase the temperature of the substrate 25, it is not always desirable to do this, because highly energetic plasma species often provide different etching characteristics than low energy plasma species. Thus, it is preferred to change the temperature of substrate using a heater 130, and because the substrate 25 is already partially heated by the plasma, the resistance of the resistive heating element 145 of the heater 130 can be selected to increase the temperature of the substrate 25 by a smaller amount than the ultimate temperature needed for the process. For example, a substrate 25 that is heated to about 100 to 250° C. by the plasma itself, can be heated by a suitable heater 130 to rise in temperature by another 150° C. to achieve the desired temperatures of 250° C. to 400° C. for the etching of copper or platinum. For this application, a suitable heater 130 comprises a resistive heating element 145 having a resistance of from about 0.5 to about 50 ohms. Of course, the resistance of the heater 130 can be increased or decreased depending on the temperature differential between the plasma sustained temperature of the substrate 25 and the desired substrate processing temperature, which will depend on the process parameters and on the type of process being conducted on the substrate 25.

Figure 3:
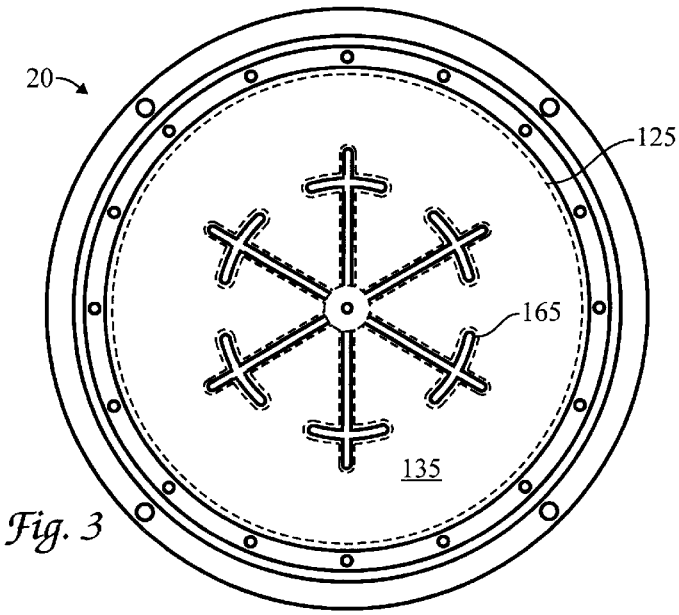
FIG. 3 is a schematic top view of the electrostatic chuck of FIG. 2 showing a receiving surface having grooves for holding heat transfer gas.

The polymer 120 comprises a resilient and compliant material that is capable of conforming to the substrate 25 electrostatically held on the receiving surface 135 of the chuck to form a gas tight seal along a peripheral edge 150 of the substrate 25. Grooves 165 are provided in the receiving surface 135 to hold a heat transfer gas, such as helium, which enhances heat transfer rates between the substrate 25 and the receiving surface 135. Referring to FIG. 3, preferably, the grooves 165 form a pattern of intersecting channels, spaced apart, sized, and distributed so that heat transfer gas held in the grooves 165 contacts substantially the entire surface of the substrate 25. Preferably, the polymer 120 comprises a receiving surface 135 that is sufficiently compliant to provide a seal having substantially no gaps along the peripheral edge 150 of the substrate 25 to substantially reduce leakage of heat transfer gas. Excessive heat transfer gas leakage below some parts of the substrate 25 reduces the pressure of heat gas below other parts of the substrate 25. This reduces heat transfer rates in these areas, causing hot spots to form on the substrate 25, which result in non-uniform processing rates across the substrate surface. The gas tight seal at the peripheral edge 150 of the substrate 25 serves to contain the heat transfer gas below the substrate 25 and reduce leakage of heat transfer gas into the chamber 30.

The polymer 120 comprises a polymeric material which is resistant to erosion in process environment, such as polyimide, polyamide, polyetherimide, polyketone, polyetherketone, polyacrylate, or fluoroethylene. Preferably, the polymer 120 comprises a thermal conductivity that is sufficiently high to allow heat transmission between the heater 130 and the substrate 25 resting on the receiving surface 135 of the chuck 20. The polymer 120 can comprise a monolithic polymer in which both the electrode 125 and the heater 130 are embedded, as shown in FIG. 1, or one or more polymer layers 120a–c having a thickness of from about 25 to about 150 μm, as shown in FIG. 2. Preferably, the polymer 120 comprises one or more polyimide layers laminated together to simplify manufacture of the electrostatic chuck 20 and to reduce thermal stresses on the polymer 120 caused by differences in thermal expansion between the electrode 125 and the resistive heating element 145. In this version, the polymer comprises an embedded electrode 125 to form a flexible laminate.

In one embodiment, the polymer 120 further comprises a hard puncture resistant layer 155 that is sufficiently hard to protect the polymer 120 from rupturing on contact with a sharp edged particle, such as a fragment from a broken substrate 25. Preferably, the puncture resistant layer 155 comprises a layer of fibers (not shown) sufficiently hard to increase the puncture resistance of the polymer 120 so that sharp fragments and debris do not penetrate, thereby protecting the electrode 125 from shorting in the process environment. More preferably, the puncture resistant layer 155 comprises aromatic polyamide fibers in a polyimide matrix, which provide the desired hardness and fracture toughness. Suitable aromatic polyimide fibers include aramid and Kevlar.

In another embodiment, shown in FIG. 2, the electrostatic chuck 20 further comprises a thermal insulator 170 below the heater 130 that thermally insulates the electrostatic chuck 20 from the surface 50 of the process chamber 30. One problem with electrostatic chucks 20 is the difficulty in forming a vacuum seal between the electrostatic chuck 20 and the lower surface 50 of the process chamber 30. At this surface 50, fluid, gas, and electrical feedthroughs extend into the process chamber 30, and these feedthroughs have surrounding gas seals. The feedthroughs are isolated from the heat provided by the heater 130 to maintain the integrity of their gas seals. In conventional process chambers, a vacuum seal is formed between the electrostatic chuck 20 and a surface 50 of the process chamber 30 or a support 55 by an O-ring made from a compliant polymer, such as polyethylene. However, the O-rings often thermally degrade at temperatures in excess of about 150° C., and they lose their resilience and ability to maintain the integrity of the vacuum seal. The thermal insulator 170 below the heater 130 thermally insulates the surface 50 of the process chamber 30 from the heater 130 and enables the use of O-rings 175 to form gas tight seals around the feedthroughs.

The thermal insulator 170 provides a temperature drop or differential between the heater 130 and the surface 50 in the chamber. Preferably, the thermal insulator 170 comprises a thickness and thermal impedance selected to provide a temperature differential of at least about 100° C. between the heater 130 and the surface 50 of the process chamber 30 when the heater 130 is operated to raise the substrate 25 to a temperature of at least 150° C. The thermal insulator 170 is composed of a polymer or ceramic, and can comprise a monolithic structure with the electrode 125 and heater 130, as shown in FIG. 1, or a separate structure bonded to the lower surface of the heater 130, as shown in FIG. 2. As also shown in FIG. 2, the thermal insulator 170 can comprise one or more layers 170a–c of a polymer, each having a thickness of from about 250 to about 1,600 μm. Generally, the thermal insulator 170 comprises polyimide, polyketone, polyetherketones, polycarbonate, polystyrene, polyvinylchloride, polypropylene, polyetherketone, or fluoroethylene.

Figure 4:
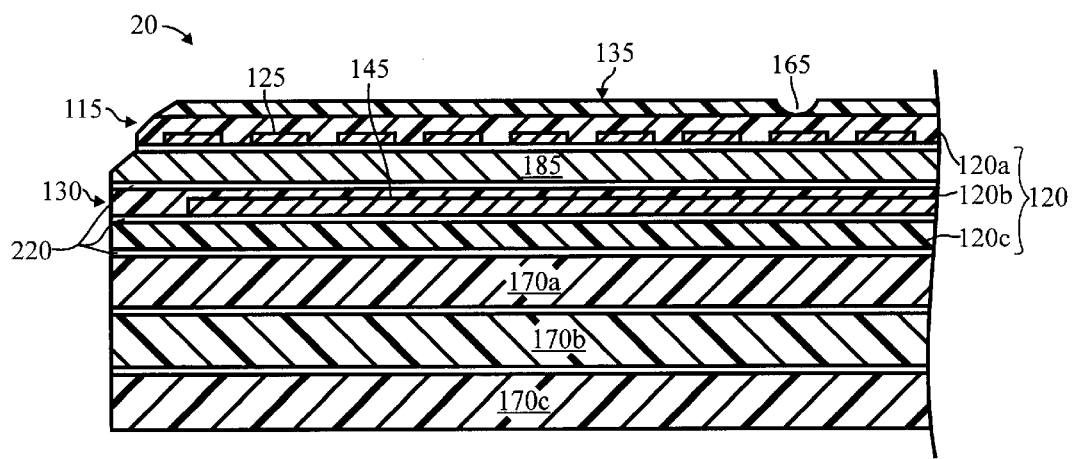
FIG. 4 is a schematic partial sectional side view of an electrostatic chuck having a thermal conductor between the electrode and the heater.

In yet another embodiment, shown in FIG. 4, the electrostatic chuck 20 further comprises a thermal conductor 185 between the electrostatic member 115 and the heater 130. The thermal conductor 185 thermally couples the electrostatic member 115 to the heater 130, and provides a thermal mass that reduces temperature fluctuations in the receiving surface 135. Preferably, the thermal conductor 185 is shaped as a plate that serves as a base for supporting the flexible laminate of the electrostatic member 115. The thermal conductor 185 can comprise a ceramic, metallic, or polymeric material that is resistant to erosion in the process environment, and has a thermal conductivity sufficiently high to thermally couple the heater 130 to the electrostatic member 115. Preferably, the thermal conductor 185 comprises a thermal conductivity of from about 80 to about 150 W/m° C., and a thickness of from about 1 to about 10 mm.

To operate the electrostatic chuck 20, the process chamber 30 is evacuated and maintained at a sub-atmospheric pressure. A substrate 25 is placed on the receiving surface 135 of the electrostatic chuck 20. The electrode 125 of the electrostatic chuck 20 is electrically biased with respect to the substrate 25 by a voltage of from about 1000 to about 3000 volts DC supplied by a chuck voltage supply 195. A heat transfer gas, typically helium, is supplied through grooves 165 in the receiving surface 135 to the interface between the substrate 25 and the electrostatic chuck 20 to thermally couple the substrate 25 to the electrostatic chuck 20. Electrical power is supplied to the heating element 145 of the heater 130 by a heater power supply 200 to raise the substrate 25 to the desired temperature. Typically, the power level of the current applied to the heater 130 is from about 20 to about 400 watts. Thereafter, an energized process gas is provided in the process chamber 30 to process the substrate 25. During processing, the temperature of the substrate 25 is monitored using a temperature sensor 215 embedded in the receiving surface 135 and positioned close to the heater 130. The temperature sensor 215 provides a signal to a temperature controller 205 forming a closed control loop that maintains the substrate 25 within a narrow range of temperatures. Preferably, the electrostatic chuck 20 of the present invention can maintain the substrate 25 within about ±20° C., and more preferably within about ±5° C., of temperatures in a range of from about 100 to about 400° C.

A method of fabricating an electrostatic chuck 20 according to the present invention will be described; however, other methods of fabrication can be used and the present invention should not be limited to the illustrative methods described herein. The electrostatic chuck 20 is fabricated by forming a polymer 120 enclosing an electrode 125 and a heater 130, the polymer 120 having a surface 135 adapted to receive the substrate 25. Preferably, one or more layers of polymer, electrode, and heater are joined to one another. For example, the polymer 120 can be fabricated from a set of polymer layers 120a–c, as illustrated in FIG. 2. Preferably, heat and pressure are applied to the polymer layers 120a–c to cause the polymer layers to become malleable and adhere to one another and to bond to the electrode 125 and heater 130. The pressure is typically applied on the polymer layers 120a–c in a pressure forming apparatus such as an autoclave, platen press and isostatic press. A typical heating cycle comprises (i) ramping up the temperature at a rate of about 12° F./min for about 15 minutes to allow outgassing of byproducts from the polymer layers 120a–c; (ii) holding the temperature at the curing temperature of the polymeric materials, typically from about 350 to 400° C., for about 50 to 60 minutes; and (iii) ramping the temperature down at a rate of about 12° C./min for about 15 minutes. Optionally, cyanoacrylate is used to hold the electrode 125, the heater 130 and the temperature sensor 215 together prior to joining of the polymer layers 120a–c to form a laminated polymer 120.

Another method of fabricating the electrostatic chuck 20 comprises forming a laminate of one or more electrically conductive layers sandwiched between polymer layers 120a–c to form the electrode 125 and the heater 130. Preferably, this method of forming the heater 130 or electrode 125 uses a multi-layer film comprising a first polymer layer 120c with an electrically conductive layer thereon, which is processed to form the resistive heating element 145 of the heater 130 and is then covered by a second polymer layer 120b. Suitable commercially available multi-layer films include, for example, Kapton® KJ film; Kapton® HKJ or EKJ composite films comprising H-polymer (PMDA/ODA); and Kapton® HKJ or EKJ composite film comprising an E-polymer layer. More preferably, the multi-layer film comprises a first polymeric layer 120c having a thickness of from about 25 to about 130 μm, and an electrically conductive layer having a thickness of from about 25 to about 75 μm. Another electrically conductive layer is etched, routed, or milled to form the electrode 125, and a third polymer layer 120a is bonded over the electrode 125. The resultant assembly of layers are bonded to the polymer layers 120b,c, enclosing the heater 145, to form the electrostatic chuck 20. The polymer layers 120a–c can be bonded together using an adhesive layer 220 and/or by applying a sufficiently high pressure and temperature as described above. Suitable adhesives include, for example, acrylics such as methacrylate, polyesters, polyamides, polyurethanes, epoxies, silicone containing adhesives, and mixtures thereof.

In addition, the thermal insulator 170 and thermal conductor 185 are also bonded to the polymer 120 enclosing the electrode 125 and the heater 130. A suitable thermal insulator 170 comprises one or more layers of polymer or ceramic material. Preferably, the thermal insulator 170 comprises from about 2 to about 6 polymer layers 170a–c, as shown in FIGS. 2 and 4; each layer having a thickness of from about 250 to about 1600 μm. The thermal conductor 185 is shaped and sized to maximize heat transfer rates between the electrostatic member 115 and heater 130. The thermal conductor 185 comprises a material having a thermal conductivity sufficiently high to thermally couple the heater 130 to the electrostatic member 115 to reduce any temperature differences therebetween. Suitable materials include ceramics, polymers, and metals, for example, aluminum, copper, or alloys thereof. Preferably, the thermal conductor 185 comprises anodized aluminum which is resistant to erosion in semiconductor processes. More preferably, the thermal conductor 185 comprises surfaces that are sufficiently smooth to enhance thermal coupling between the heater 130, electrostatic member 115, and the thermal conductor 185. Smooth surfaces ensure that these surfaces are in good thermal contact to maximize heat transfer between the surfaces. It has been found that a suitable smooth surface comprises a Reynolds number of 10 or less. The thermal insulator 170 or thermal conductor is bonded to the heater 130 using an adhesive layer 220, as shown in FIG. 4, or substantially without an adhesive as shown in FIG. 2.

The electrostatic chuck 20 of the present invention has several advantages over conventional chucks 20. Because the substrate 25 is heated directly through the receiving surface 135, a higher heating efficiency and increased response time is obtained compared to conventional infrared lamp heat sources. Moreover, covering or embedding the electrode 125 and the resistive heating element 145 in compliant polymer 120 provides a receiving surface 135 that forms a gas tight seal with the substrate 25 to effectively contain the heat transfer gas below the substrate 25. This in turn provides more uniform temperatures across the substrate surface. Furthermore, the thermal insulator 170 reduces heat flow from the heater 130 to the surface 50 in the chamber 30, thereby reducing thermal degradation of the components and seals at the surface 50. In addition, the thermal conductor 185 enhances the uniformity of heat transfer rates from the heater to the substrate 25 and also facilitates bonding of the heater 130 to the polymer 120 of the electrostatic member 115.

Although the present invention has been described in detail with regard to certain preferred versions thereof, other versions are possible. For example, the heater 130 can comprise multiple resistive heating elements placed to heat different regions of the substrate 25 at different rates or to different temperatures. Also, the electrostatic chuck 20 can have a different shape and structure to permit its use in other process chambers and processes than those provided as illustrative examples herein. Therefore, the appended claims should not be limited to the description of the preferred versions contained herein.

What is claimed:

1. An electrostatic chuck capable of holding a substrate, the electrostatic chuck comprising:
    (a) a polymer having a surface capable of receiving the substrate thereon;
    (b) an electrode covered by the polymer, the electrode being chargeable to electrostatically hold the substrate; and
    (c) a heater in the polymer.

2. The electrostatic chuck of claim 1 wherein the heater is surrounded by the polymer.

3. The electrostatic chuck of claim 1 wherein the heater comprises a resistive heating element having a resistance that is sufficiently low to heat the substrate substantially without thermal degradation of the polymer.

4. The electrostatic chuck of claim 1 wherein the heater comprises a resistive heating element having a resistance that is sufficiently high to raise the temperature of the substrate by at least about 150° C.

5. The electrostatic chuck of claim 1 wherein the heater comprises a resistive heating element having a resistance of from about 0.5 to about 50 ohms.

6. The electrostatic chuck of claim 1 wherein the heater comprises a resistive heating element comprising copper, iron, molybdenum, tungsten, inconel, or alloys thereof.

7. The electrostatic chuck of claim 1 wherein the polymer comprises a flexible laminate enclosing the electrode and heater.

8. The electrostatic chuck of claim 1 wherein the polymer comprises polyimide, polyamide, polyetherimide, polyketone, polyetherketone, polyacrylate or fluoroethylene.

9. The electrostatic chuck of claim 1 further comprising a thermal insulator below the heater.

10. The electrostatic chuck of claim 9 wherein the thermal insulator comprises a thickness that is sufficiently high to provide a temperature differential of at least about 100° C. between the heater and a surface of the process chamber.

11. The electrostatic chuck of claim 1 further comprising a thermal conductor in the polymer.

12. The electrostatic chuck of claim 11 wherein the thermal conductor comprises a thermal conductivity of from about 80 to about 150 W/m° C.

13. A process chamber for processing a substrate in a gas, the process chamber comprising:
    (a) an electrostatic chuck according to claim 1;
    (b) a gas distributor;
    (c) a gas energizer; and
    (d) a gas exhaust,
whereby gas distributed by the gas distributor, is energized by the gas energizer to process the substrate held on the electrostatic chuck, and exhausted by the gas exhaust.

14. A method for fabricating an electrostatic chuck capable of holding a substrate, the method comprising the steps of forming a polymer covering an electrode and forming a heater in the Polymer, a surface of the polymer being adapted to receive the substrate.

15. The method of claim 14 comprising the steps of:
    (i) forming one or more layers comprising the polymer, electrode, and heater; and
    (ii) joining the layers to one another.

16. The method of claim 15 wherein the step of joining the layers comprises the steps of applying a pressure on the layers and heating the layers.

17. The method of claim 14 wherein one or more of the electrode and heater are formed by etching a metal layer on a polymer layer.

18. The method of claim 14 further comprising the step of providing a thermal insulator below the heater.

19. The method of claim 14 further comprising the step of providing a thermal conductor between the electrode and the heater.

20. A method of processing a substrate in a process chamber, the method comprising the steps of:
    (a) placing the substrate on a receiving surface of an electrostatic chuck, the electrostatic chuck comprising an electrode and a heater in polymer;
    (b) charging the electrode to electrostatically hold the substrate; and
    (c) controlling a power level of the heater to control a temperature of the substrate.

21. The method of claim 20 wherein the power level of the heater is maintained sufficiently low to reduce thermal degradation of the polymer.

22. The method of claim 20 wherein the power level of the heater is maintained from about 20 to about 400 watts.

23. An electrostatic chuck capable of holding a substrate in a process chamber, the electrostatic chuck comprising:
    (a) a polymer having a surface capable of receiving the substrate;
    (b) an electrode covered by the polymer, the electrode being chargeable to electrostatically hold the substrate;
    (c) a thermal conductor below the polymer; and
    (d) a heater below the thermal conductor, the heater being in the polymer.

24. The electrostatic chuck of claim 23 wherein the thermal conductor comprises a thermal conductivity of from about 80 to about 150 W/m° C.

25. The electrostatic chuck of claim 23 wherein the thermal conductor comprises a metal.

26. The electrostatic chuck of claim 25 wherein the thermal conductor comprises aluminum or copper.

27. The electrostatic chuck of claim 23 wherein the heater comprises a resistive heating element having a resistance that is sufficiently high to raise the temperature of the substrate by at least about 150° C.

28. The electrostatic chuck of claim 23 wherein the heater comprises a resistive heating element having a resistance of from about 0.5 to about 50 ohms.

29. The electrostatic chuck of claim 23 wherein the heater and thermal conductor are enclosed in the polymer.

30. The electrostatic chuck of claim 23 wherein the heater comprises a resistive heating element comprising copper, iron, molybdenum, tungsten, inconel, or alloys thereof.

31. The electrostatic chuck of claim 23 wherein the polymer comprises polyimide, polyamide, polyetherimide, polyketone, polyetherketone, polyacrylate or fluoroethylene.

32. A method for fabricating an electrostatic chuck capable of holding a substrate, the method comprising the steps of:
(a) forming an assembly comprising polymer layers, an electrode, a thermal conductor, and a heater; and
(b) joining the polymer layers to one another to form an electrostatic chuck having a surface adapted to receive the substrate, wherein a polymer layer is above the heater and a polymer layer is below the heater.

33. The method of claim 32 wherein step (b) further comprises the step of heating the assembly.

34. The method of claim 32 wherein step (b) further comprises the step of applying a pressure on the assembly.

35. The method of claim 34 wherein the pressure is applied in a pressure forming apparatus selected from the group consisting of an autoclave, platen press, and isostatic press.

36. The method of claim 32 wherein the polymer comprises polyimide, polyamide, polyetherimide, polyketone, polyetherketone, polyacrylate or fluoroethylene.

37. An electrostatic chuck capable of holding a substrate in a process chamber, the electrostatic chuck comprising:
(a) a polymer having a surface capable of receiving the substrate;
(b) an electrode covered by the polymer, the electrode being chargeable to electrostatically hold the substrate;
(c) a heater in the polymer capable of heating the substrate; and
(d) a thermal insulator below the heater.

38. The electrostatic chuck of claim 37 wherein the thermal insulator comprises a thickness that is sufficiently high to provide a temperature differential of at least about 100° C. between the heater and a surface of the process chamber.

39. The electrostatic chuck of claim 37 wherein the thermal insulator comprises a layer of polymer or ceramic.

40. The electrostatic chuck of claim 37 further comprising a thermal conductor between the heater and the polymer, the thermal conductor comprising a thermal conductivity of from about 80 to about 150 W/m° C.

41. The electrostatic chuck of claim 40 wherein the thermal conductor comprises a metal.

42. The electrostatic chuck of claim 40 wherein the thermal conductor comprises aluminum or copper.

43. The electrostatic chuck of claim 37 wherein the heater comprises a resistive heating element having a resistance that is sufficiently high to raise the temperature of the substrate by at least about 150° C.

44. The electrostatic chuck of claim 37 wherein the heater comprises a resistive heating element having a resistance of from about 0.5 to about 50 ohms.

45. The electrostatic chuck of claim 37 herein the polymer encloses the heater and the thermal insulator.

46. The electrostatic chuck of claim 37 wherein the heater comprises a resistive heating element comprising copper, iron, molybdenum, tungsten, inconel, or alloys thereof.

47. The electrostatic chuck of claim 37 wherein the polymer comprises polyimide, polyamide, polyetherimide, polyketone, polyetherketone, polyacrylate or fluoroethylene.

48. A method for fabricating an electrostatic chuck capable of holding a substrate, the method comprising the steps of:
(a) forming an assembly comprising polymer layers, an electrode, a heater, and a thermal insulator; and
(b) joining the polymer layers to one another to form an electrostatic chuck having a surface adapted to receive the substrate, wherein a polymer layer is above the heater and a polymer layer is below the heater.

49. The method of claim 48 wherein step (b) further comprises the step of heating the assembly.

50. The method of claim 48 wherein step (b) further comprises the step of applying a pressure on the assembly.

51. The method of claim 50 wherein the pressure is applied in a pressure forming apparatus selected from the group consisting of an autoclave, platen press, and isostatic press.

52. The method of claim 48 wherein the polymer comprises polyimide, polyamide, polyetherimide, polyketone, polyetherketone, polyacrylate or fluoroethylene.

53. An electrostatic chuck according to claim 23 wherein the polymer comprises a layer above the thermal conductor and a layer below the heater.

54. An electrostatic chuck capable of holding a substrate, the electrostatic chuck comprising:
(a) a polymer having a surface capable of receiving the substrate thereon;
(b) an electrode covered by the polymer, the electrode being chargeable to electrostatically hold the substrate;
(c) a heating element abutting the polymer; and
(d) a bottom surface below the heating element,
wherein the bottom surface is adapted to be positioned on a surface of a process chamber.

55. The electrostatic chuck of claim 54 wherein the heating element comprises a resistance of from about 0.5 to about 50 ohms.

56. The electrostatic chuck of claim 54 wherein the heating element comprises copper, iron, molybdenum, tungsten, inconel, or alloys thereof.

57. The electrostatic chuck of claim 54 wherein the polymer comprises one or more layers.

58. The electrostatic chuck of claim 54 further comprising a thermal insulator above the heating element.

* * * * *